United States Patent
Takeda

(10) Patent No.: US 10,649,338 B2
(45) Date of Patent: May 12, 2020

(54) STEPPED WAFER AND METHOD FOR MANUFACTURING STEPPED WAFER

(71) Applicant: Mitsubishi Electric Corporation, Tokyo (JP)

(72) Inventor: Naoyuki Takeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 278 days.

(21) Appl. No.: 15/571,904

(22) PCT Filed: Jul. 8, 2015

(86) PCT No.: PCT/JP2015/069583
§ 371 (c)(1),
(2) Date: Nov. 6, 2017

(87) PCT Pub. No.: WO2017/006447
PCT Pub. Date: Jan. 12, 2017

(65) Prior Publication Data
US 2018/0136560 A1    May 17, 2018

(51) Int. Cl.
*G03F 7/30* (2006.01)
*B24B 1/00* (2006.01)
*B24B 7/22* (2006.01)
*B24B 9/00* (2006.01)
*H01L 21/304* (2006.01)
*B24B 9/06* (2006.01)
*G03F 7/039* (2006.01)
*G03F 7/16* (2006.01)
(Continued)

(52) U.S. Cl.
CPC ............. *G03F 7/3092* (2013.01); *B24B 1/00* (2013.01); *B24B 7/22* (2013.01); *B24B 7/228* (2013.01); *B24B 9/00* (2013.01); *B24B 9/065* (2013.01); *G03F 7/039* (2013.01); *G03F 7/162* (2013.01); *G03F 7/20* (2013.01); *G03F 7/30* (2013.01); *H01L 21/02035* (2013.01); *H01L 21/304* (2013.01); *H01L 29/32* (2013.01)

(58) Field of Classification Search
CPC ........ G03F 7/3092; G03F 7/039; G03F 7/162; G03F 7/20; G03F 7/30; B24B 7/228; B24B 9/065; H01L 21/02035; H01L 29/32

See application file for complete search history.

(56) References Cited

U.S. PATENT DOCUMENTS

| 5,389,198 A | * | 2/1995 | Koide | ............... H01L 21/30608 |
| | | | | 216/2 |
| 2012/0231705 A1 | * | 9/2012 | Tanaka | ................ H01L 21/6838 |
| | | | | 451/41 |

FOREIGN PATENT DOCUMENTS

| JP | 2011-054808 A | 3/2011 |
| JP | 5266869 B2 | 8/2013 |

OTHER PUBLICATIONS

International Search Report issued in PCT/JP2015/069583; dated Aug. 4, 2015.

* cited by examiner

*Primary Examiner* — Matthew E. Gordon
(74) *Attorney, Agent, or Firm* — Studebaker & Brackett PC

(57) ABSTRACT

The present invention has an object of providing a stepped wafer that can prevent a resist from remaining after development, and a method for manufacturing the stepped wafer. The stepped wafer according to the present invention is a stepped wafer having a step and whose main surface is thinner in a center portion and is thicker in an outer (Continued)

periphery. The step includes a curved surface with a radius of curvature ranging from 300 μm to 1800 μm.

7 Claims, 5 Drawing Sheets

(51) Int. Cl.
*G03F 7/20* (2006.01)
*H01L 21/02* (2006.01)
*H01L 29/32* (2006.01)

STEPPED WAFER AND METHOD FOR MANUFACTURING STEPPED WAFER

TECHNICAL FIELD

The present invention relates to a stepped wafer and a method for manufacturing the same.

BACKGROUND ART

Stepped wafers have been adopted at present to reduce warpage or deflection of semiconductor wafers 300 μm or less in thickness. The stepped wafers refer to semiconductor wafers with rear surface whose center portion is formed thinner than its outer periphery.

Steep stepped portions (side surfaces of depressions) of the stepped wafers have a negative effect on lithography processes or dicing processes. To address such a problem, techniques for forming a slope from the outside of a stepped wafer (closer to the outer periphery) to the inside thereof (closer to the center portion) have been conventionally proposed as a replacement for the steep stepped portions (see, for example, Patent Documents 1 and 2).

PRIOR-ART DOCUMENTS

Patent Documents

Patent Document 1: Japanese Patent No. 5266869
Patent Document 2: Japanese Patent Application Laid-Open No. 2011-54808

SUMMARY

Problems to be Solved by the Invention

Application of a positive resist in spin coating to a semiconductor wafer having the shape of the stepped wafer proposed by Patent Documents 1 or 2 causes a problem with the remaining resist in the stepped portion of the stepped wafer after development. The remaining resist in the wafer also causes a problem of contaminating a stepped wafer or devices to be used in the subsequent processes and reducing yields of final products manufactured using the stepped wafer.

The present invention has been conceived to solve such problems, and has an object of providing a stepped wafer that can prevent a resist from remaining after development, and a method for manufacturing the stepped wafer.

Means to Solve the Problems

To solve the problems, the stepped wafer according to the present invention is a stepped wafer having a step and whose main surface is thinner in a center portion and is thicker in an outer periphery, wherein the step includes a curved surface with a radius of curvature ranging from 300 μm to 1800 μm.

The method for manufacturing the stepped wafer according to the present invention is a method for manufacturing a stepped wafer having a step and whose main surface is thinner in a center portion and is thicker in an outer periphery, and the method includes (a) forming the step including a curved surface with a radius of curvature ranging from 300 μm to 1800 μm.

Effects of the Invention

The stepped wafer according to the present invention is a stepped wafer having a step and whose main surface is thinner in a center portion and is thicker in an outer periphery, wherein the step includes a curved surface with a radius of curvature ranging from 300 μm to 1800 μm. Thus, the stepped wafer can prevent a resist from remaining after development.

The method for manufacturing the stepped wafer is a method for manufacturing a stepped wafer having a step and whose main surface is thinner in a center portion and is thicker in an outer periphery, and the method includes (a) forming the step including a curved surface with a radius of curvature ranging from 300 μm to 1800 μm. Thus, the stepped wafer can prevent a resist from remaining after development.

The objects, features, aspects and advantages of the present invention will become more apparent from the following detailed description and the accompanying drawings.

DESCRIPTION OF EMBODIMENTS

Embodiments according to the present invention will be hereafter described based on the drawings.

[Premise Technique]

First, the technique on which the present invention is predicated (premise technique) will be described.

FIGS. 13 to 16 illustrate example states of a semiconductor wafer 15 to which a positive resist is applied according to the premise technique. In FIGS. 13 to 16, the top surface of the semiconductor wafer 15 in the paper indicates a rear surface of the semiconductor wafer 15.

Figure 13:
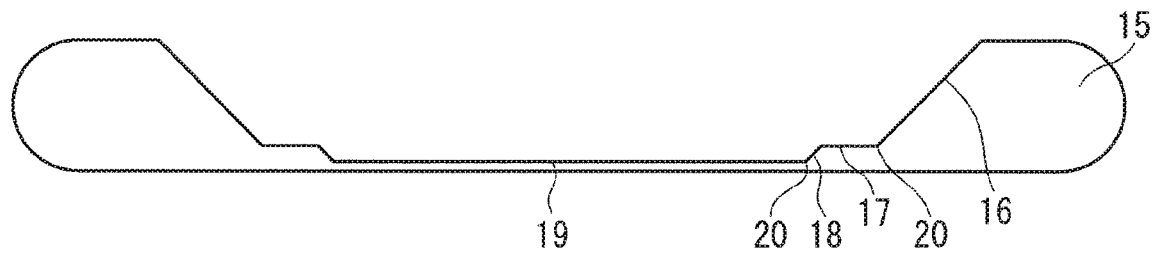
FIG. 13 illustrates an example state of a semiconductor wafer to which a positive resist is applied according to a premise technique.

As illustrated in FIG. 13, the semiconductor wafer 15 according to the premise technique is a stepped wafer including a first linear sloped surface 16, a first grinded surface 17, a second linear sloped surface 18, and a second grinded surface 19. Each of a connecting portion between the first linear sloped surface 16 and the first grinded surface 17 and a connecting portion between the second linear sloped surface 18 and the second grinded surface 19 is a straight-line connecting portion 20.

Figure 14:
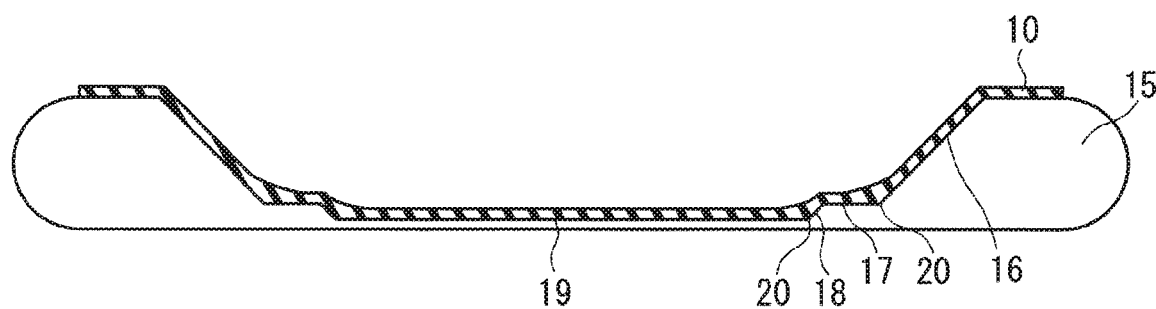
FIG. 14 illustrates an example state of the semiconductor wafer to which the positive resist is applied according to the premise technique.

As illustrated in FIG. 14, when a positive resist 10 is applied to the rear surface of the semiconductor wafer 15 in spin coating, the positive resist 10 becomes less prone to flow through the straight-line connecting portions 20 with angles. Consequently, the positive resist 10 is applied thicker to the straight-line connecting portions 20 than to the other portions.

Figure 15:
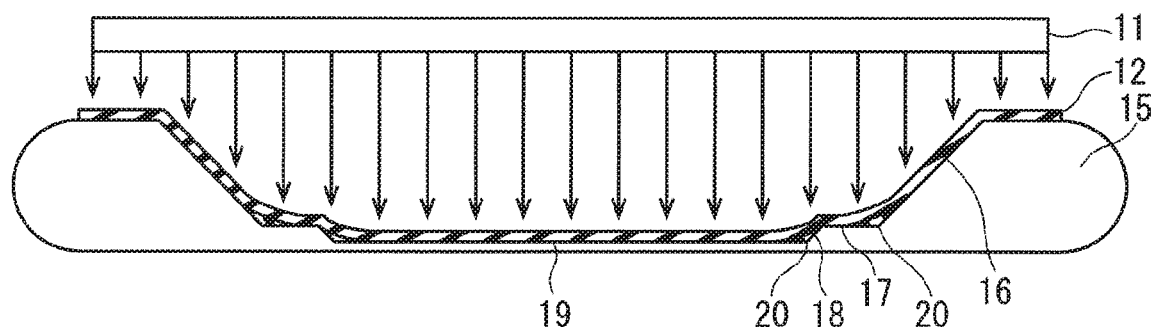
FIG. 15 illustrates an example state of the semiconductor wafer to which the positive resist is applied according to the premise technique.
Figure 16:
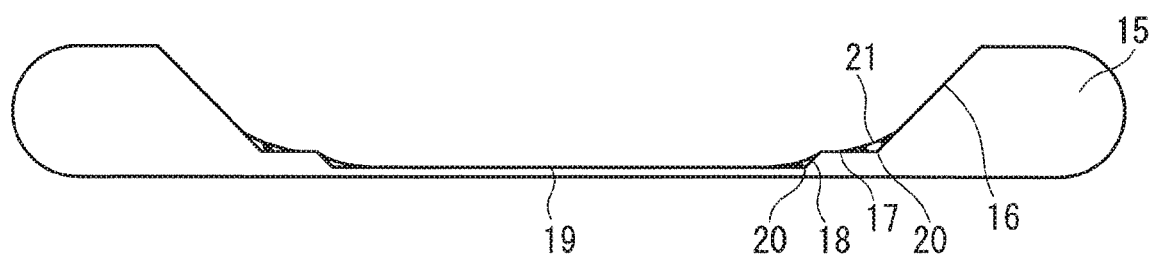
FIG. 16 illustrates an example state of the semiconductor wafer to which the positive resist is applied according to the premise technique.

Then, illuminating (exposing light to) the positive resist 10 using an exposure light source 11 in a state of FIG. 14 does not allow a lower portion of the positive resist 10 applied to the straight-line connecting portions 20 to be sensitized as illustrated in FIG. 15. In other words, the entire positive resist 10 does not become an exposed resist 12. Thus, a residual resist 21 remains after development as illustrated in FIG. 16.

As described above, the residual resist 21 remaining after development causes a problem of contaminating the semiconductor wafer 15 or devices to be used in the subsequent processes and reducing yields of final products manufactured using the semiconductor wafer 15.

The present invention has been conceived to solve such a problem, and will be hereinafter described in detail.

Embodiment 1

First, a structure of a stepped wafer according to Embodiment 1 of the present invention will be described.

Figure 1:
FIG. 1 illustrates an example structure of a semiconductor wafer according to Embodiment 1 of the present invention.

FIG. 1 illustrates an example of a semiconductor wafer 1 that is a stepped wafer according to Embodiment 1. In FIG. 1, the top surface of the semiconductor wafer 1 in the paper indicates a rear surface of the semiconductor wafer 1.

As illustrated in FIG. 1, the semiconductor wafer 1 is a stepped wafer including a first linear sloped surface 3 (sloped portion), a first curved-surface connecting portion 4 (curved surface), a first grinded surface 5 (flat portion), a second linear sloped surface 7 (sloped portion), a second curved-surface connecting portion 8 (curved surface), and a second grinded surface 9 (flat portion). In other words, the semiconductor wafer 1 is a stepped wafer having steps and whose a main surface (rear surface) is thinner in center portion and is thicker in outer periphery. A connecting portion (boundary) between the first linear sloped surface 3 and the first grinded surface 5 is the first curved-surface connecting portion 4, whereas a connecting portion between the second linear sloped surface 7 and the second grinded surface 9 is the second curved-surface connecting portion 8.

Next, a method for manufacturing the semiconductor wafer 1 that is the stepped wafer will be described.

Figure 2:
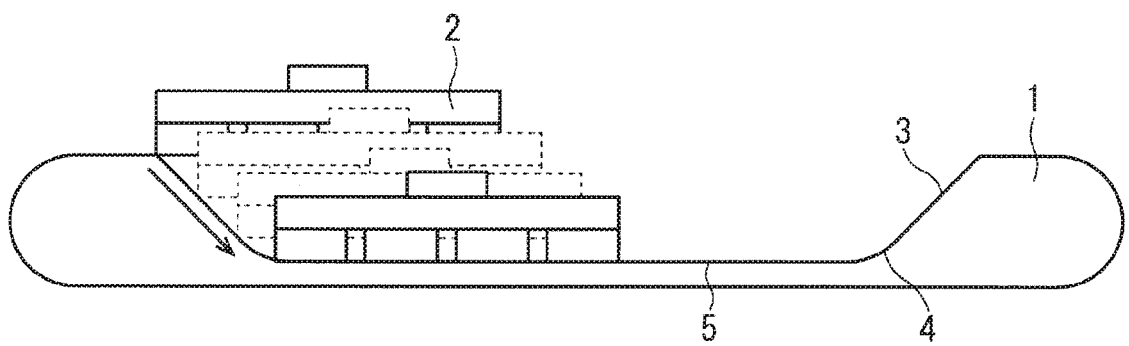
FIG. 2 illustrates an example manufacturing process of the semiconductor wafer according to Embodiment 1 of the present invention.
Figure 3:
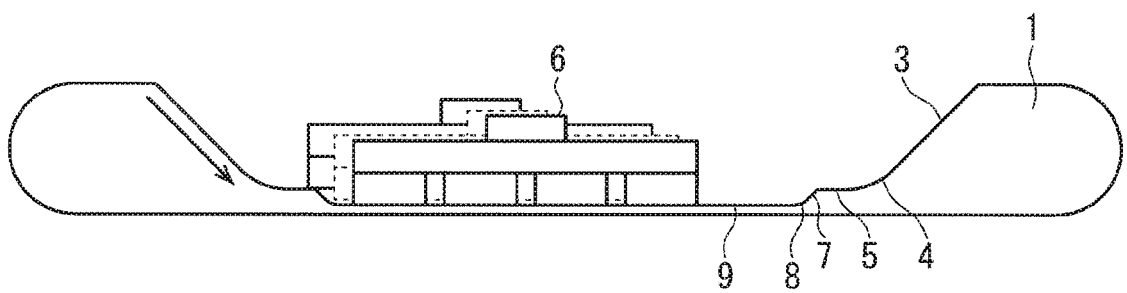
FIG. 3 illustrates an example manufacturing process of the semiconductor wafer according to Embodiment 1 of the present invention.

FIGS. 2 and 3 illustrate example manufacturing processes of the semiconductor wafer 1.

First, the semiconductor wafer 1 is fixed on a grinding stage (not illustrated).

Next, the first linear sloped surface 3 is formed 1 mm to 3 mm inside of the outermost periphery of the semiconductor wafer 1 using a first grinding wheel 2 as illustrated in FIG. 2. Here, the first grinding wheel 2 moves from the outside (closer to the outer periphery) to the inside (closer to the center portion) in a diagonal direction in a cross-sectional view while grinding the rear surface of the semiconductor wafer 1.

Next, the first curved-surface connecting portion 4 for connecting the first linear sloped surface 3 to the first grinded surface 5 to be formed later is formed using the first grinding wheel 2 as illustrated in FIG. 2. Here, the first grinding wheel 2 forms the first curved-surface connecting portion 4 with a radius of curvature ranging from 300 μm to 1800 μm. After forming the first curved-surface connecting portion 4, the first grinded surface 5 is formed using the first grinding wheel 2.

Next, the second linear sloped surface 7 and the second curved-surface connecting portion 8 are formed using a second grinding wheel 6 as illustrated in FIG. 3, similarly as the first linear sloped surface 3 and the first curved-surface connecting portion 4. Here, the second grinding wheel 6 forms the second curved-surface connecting portion 8 with a radius of curvature ranging from 300 μm to 1800 μm so as not to be in contact with the first linear sloped surface 3 or the first curved-surface connecting portion 4. The second grinding wheel 6 is a grinding wheel whose surface (grinding surface) is less coarse than that of the first grinding wheel 2, and is used for finish grinding. After forming the second curved-surface connecting portion 8, the second grinded surface 9 is formed using the second grinding wheel 6. For example, an electrode pattern is formed on the surface of the semiconductor wafer 1 facing the second grinded surface 9.

Next, application of a positive resist to the semiconductor wafer 1 (i.e., the semiconductor wafer 1 illustrated in FIG. 1) fabricated through the manufacturing processes illustrated in FIGS. 2 and 3 will be described.

Figure 4:
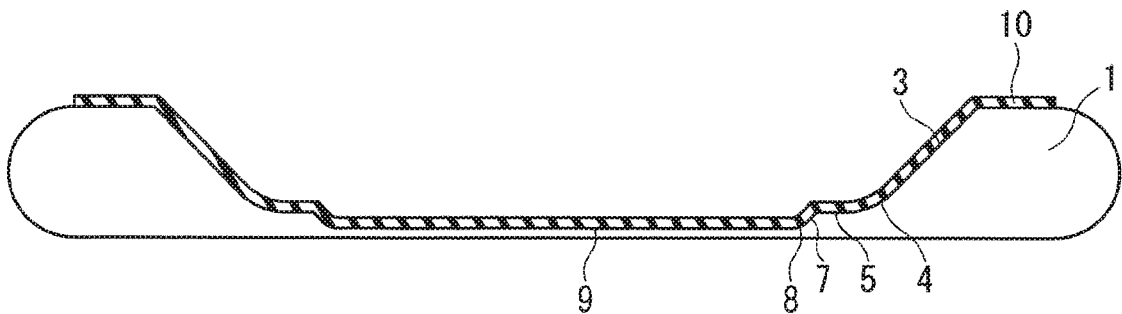
FIG. 4 illustrates an example state of the semiconductor wafer to which a positive resist is applied according to Embodiment 1 of the present invention.
Figure 5:
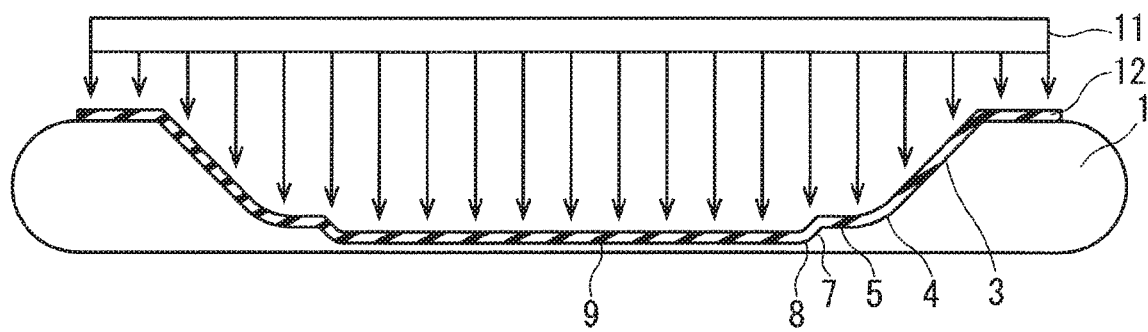
FIG. 5 illustrates an example state of the semiconductor wafer to which the positive resist is applied according to Embodiment 1 of the present invention.
Figure 6:
FIG. 6 illustrates an example state of the semiconductor wafer to which the positive resist is applied according to Embodiment 1 of the present invention.

FIGS. 4 to 6 illustrate example states of the semiconductor wafer 1 to which the positive resist 10 is applied.

As illustrated in FIG. 4, the positive resist 10 is applied on the rear surface of the semiconductor wafer 1 in spin coating with a uniform thickness over the first linear sloped surface 3, the first curved-surface connecting portion 4, the first grinded surface 5, the second linear sloped surface 7, the second curved-surface connecting portion 8, and the second grinded surface 9.

Next, as illustrated in FIG. 5, when the positive resist 10 is exposed to light using the exposure light source 11, the entire positive resist 10 is sensitized (i.e., the entire positive resist 10 becomes the exposed resist 12). Then, the entire positive resist 10 (the exposed resist 12) can be removed after development as illustrated in FIG. 6.

Figure 7:
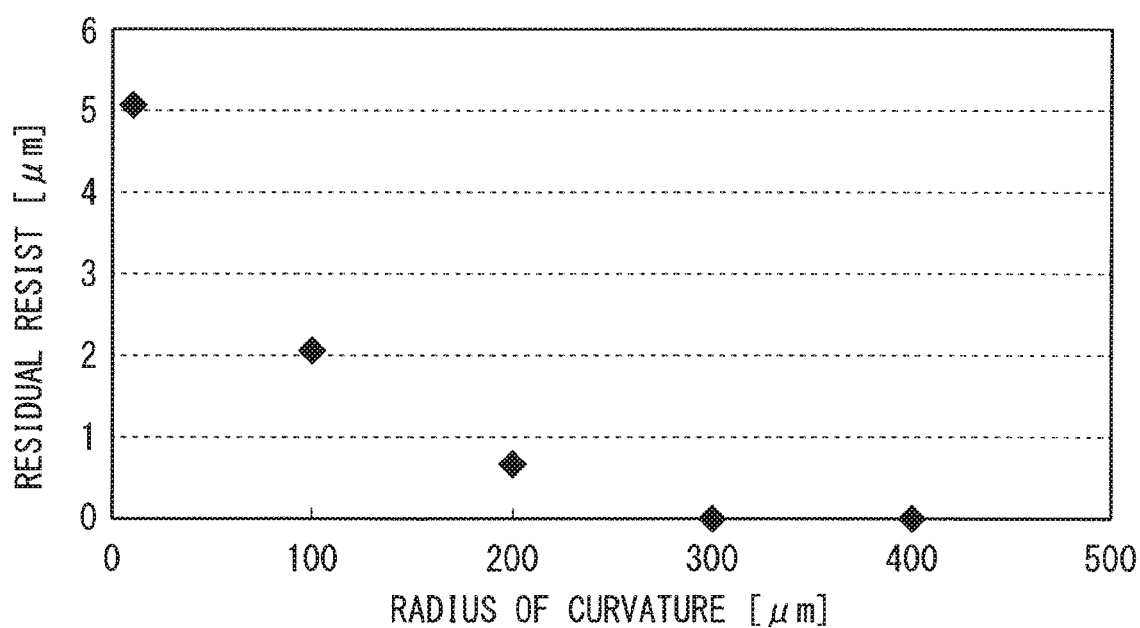
FIG. 7 is a graph illustrating an example relationship between a radius of curvature and a residual resist according to Embodiment 1 of the present invention.

FIG. 7 is a graph illustrating an example relationship between the radius of curvature and the residual resist of the semiconductor wafer 1.

As illustrated in FIG. 7, the semiconductor wafer 1 having a curved surface whose radius of curvature is larger than or equal to 300 μm is found to have no resist after application of the positive resist 10, exposure to light, and development.

In contrast, the resist remains in the semiconductor wafer 1 having a curved surface whose radius of curvature is smaller than 300 μm.

Since radiuses of curvature of the first curved-surface connecting portion 4 and the second curved-surface connecting portion 8 that are curved surfaces of the semiconductor wafer 1 according to Embodiment 1 are larger than or equal to 300 μm, the resist does not remain after development even with application of the positive resist 10. In other words, the radius of curvature of the first curved-surface connecting portion 4 is set larger than or equal to 300 μm, a rising angle at which the first linear sloped surface 3 is connected to the first grinded surface 5 is relaxed to improve the flow of the positive resist 10, thus enabling prevention of the resist from remaining in the first curved-surface connecting portion 4.

Figure 8:
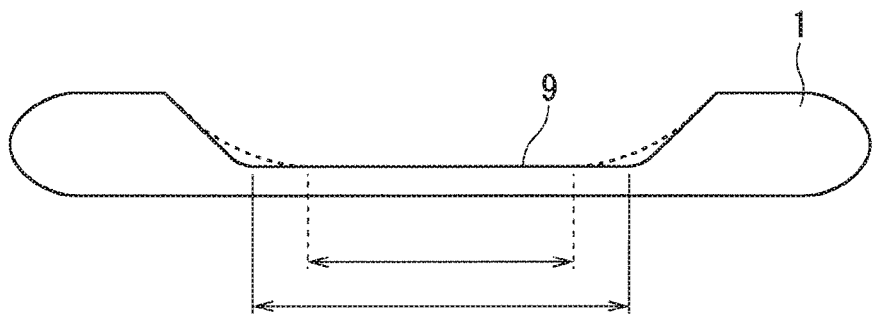
FIG. 8 illustrates a relationship between the radius of curvature and an outer periphery of the semiconductor wafer according to Embodiment 1 of the present invention.
Figure 9:
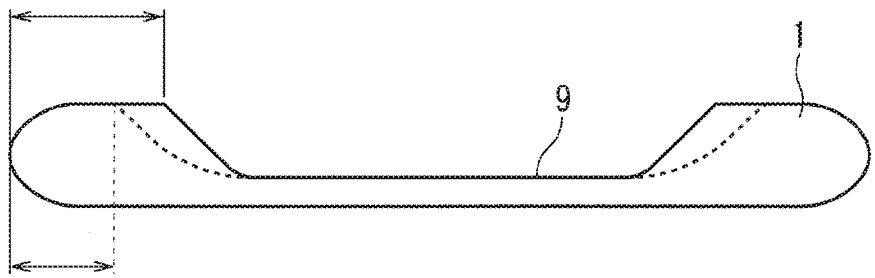
FIG. 9 illustrates a relationship between the radius of curvature and the outer periphery of the semiconductor wafer according to Embodiment 1 of the present invention.

FIGS. 8 and 9 illustrate a relationship between the radius of curvature and the outer periphery of the semiconductor wafer 1. In FIGS. 8 and 9, the solid line indicates the semiconductor wafer 1 whose radius of curvature is 300 μm, and the dotted line indicates the semiconductor wafer 1 whose radius of curvature is larger than 300 μm. Here, the number of steps of the semiconductor wafer 1 is one.

As illustrated in FIG. 8, when the outer periphery of the semiconductor wafer 1 whose radius of curvature is 300 μm is made as wide as the outer periphery of the semiconductor wafer 1 whose radius of curvature is larger than 300 μm, the semiconductor wafer 1 whose radius of curvature is larger than 300 μm has a smaller area of the second grinded surface 9 and fewer chips including an electrode pattern.

Figure 10:
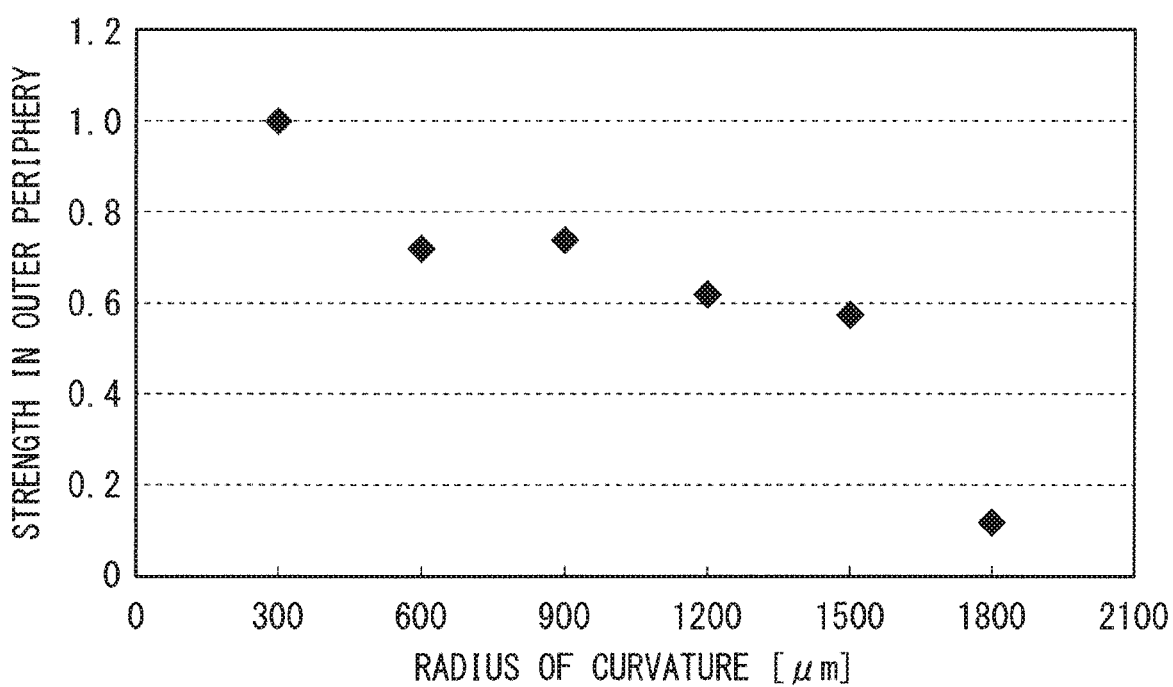
FIG. 10 is a graph illustrating an example relationship between the radius of curvature and the outer periphery of the semiconductor wafer according to Embodiment 1 of the present invention.

As illustrated in FIG. 9, when the second grinded surface 9 in the semiconductor wafer 1 whose radius of curvature is 300 μm has the same area as that in the semiconductor wafer 1 whose radius of curvature is larger than 300 μm, the semiconductor wafer 1 whose radius of curvature is larger than 300 μm has a smaller width of the outer periphery and reduced strength in the outer periphery (see FIG. 10). The reduced strength in the outer periphery of the semiconductor wafer 1 becomes a factor of increasing the frequency of fractures in the semiconductor wafer 1. As illustrated in FIG. 10, the radius of curvature of the semiconductor wafer 1 is preferably smaller than or equal to 1800 μm to have the same area of the second grinded surface 9 as that of the semiconductor wafer 1 whose radius of curvature is 300 μm and maintain the strength in the outer periphery.

Consequently, Embodiment 1 enables prevention of a resist applied to the semiconductor wafer 1 from remaining after development. Furthermore, the strength in the outer periphery of the semiconductor wafer 1 can be maintained.

Embodiment 2

Embodiment 1, which describes formation of the first curved-surface connecting portion 4 in the connecting portion between the first linear sloped surface 3 and the first grinded surface 5 and formation of the second curved-surface connecting portion 8 in the connecting portion between the second linear sloped surface 7 and the second grinded surface 9, is not limited to such.

Figure 11:
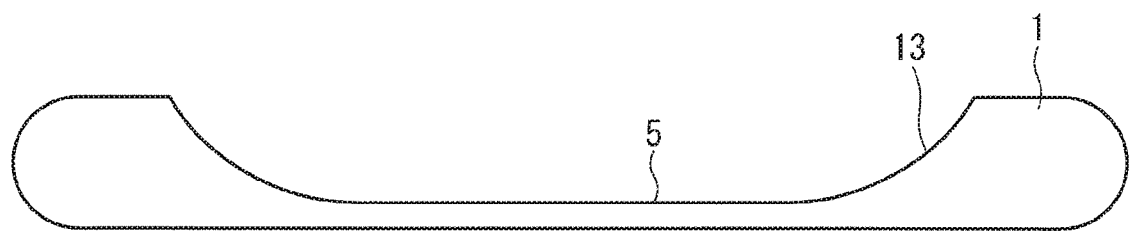
FIG. 11 illustrates an example shape of a semiconductor wafer according to Embodiment 2 of the present invention.

For example, a first curved sloped surface 13 that is a curved surface replacing the first linear sloped surface 3 and the first curved-surface connecting portion 4 in FIG. 1 may be formed as illustrated in FIG. 11. In other words, the semiconductor wafer 1 may be a stepped wafer including the first curved sloped surface 13 and the first grinded surface 5. Here, the first curved sloped surface 13 has a radius of curvature ranging from 300 μm to 1800 μm.

Figure 12:
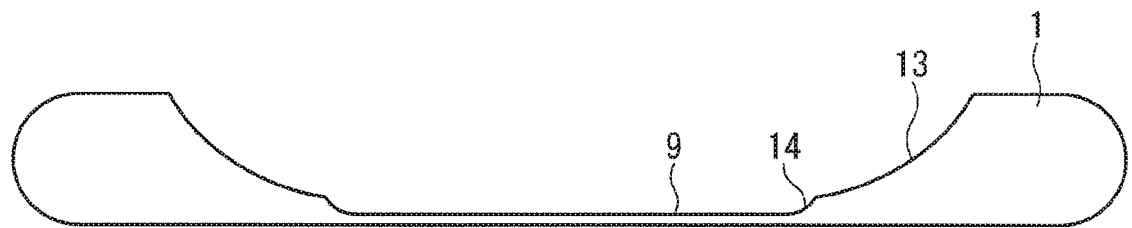
FIG. 12 illustrates an example shape of the semiconductor wafer according to Embodiment 2 of the present invention.

In addition to FIG. 11, a second curved sloped surface 14 that is a curved surface replacing the second linear sloped surface 7 and the second curved-surface connecting portion 8 in FIG. 1 may be formed as illustrated in FIG. 12. In other words, the semiconductor wafer 1 may be a stepped wafer including the first curved sloped surface 13, the second curved sloped surface 14, and the second grinded surface 9. Here, each of the first curved sloped surface 13 and the second curved sloped surface 14 has a radius of curvature ranging from 300 μm to 1800 μm.

Consequently, forming the first curved sloped surface 13 and the second curved sloped surface 14 according to Embodiment 2 enables, when a resist is applied to the semiconductor wafer 1, uniform application of the resist on the first curved sloped surface 13 and the second curved sloped surface 14 and prevention of the resist applied to the semiconductor wafer 1 from remaining in the semiconductor wafer 1 after development. Grinding the semiconductor wafer 1 using the first grinding wheel 2 and the second grinding wheel 6 also improves the flow of an etching solution (the etching solution does not stay) in an etching process for a removing fractured layer formed on the rear surface of the semiconductor wafer 1, and in-plane uniformity in the thickness of the semiconductor wafer 1 on the second grinded surface 9.

Embodiments can be freely combined, and appropriately modified or omitted within the scope of the invention.

Although this invention has been described in detail, the description is in all aspects illustrative and does not restrict the invention. Numerous modifications that have yet been exemplified will be devised without departing from the scope of the invention.

EXPLANATION OF REFERENCE SIGNS

1 semiconductor wafer, 2 first grinding wheel, 3 first linear sloped surface, 4 first curved-surface connecting portion. 5 first grinded surface, 6 second grinding wheel, 7 second linear sloped surface, 8 second curved-surface connecting portion, 9 second grinded surface, 10 positive resist, 11 exposure light source, 12 exposed resist, 13 first curved sloped surface, 14 second curved sloped surface, 15 semiconductor wafer, 16 first linear sloped surface, 17 first grinded surface, 18 second linear sloped surface, 19 second grinded surface, 20 straight-line connecting portion, 21 residual resist.

The invention claimed is:
1. A stepped wafer having a step and a main surface, wherein the stepped wafer is thinner in a center portion and is thicker in an outer periphery,
   wherein said step includes a curved surface with a radius of curvature in cross-section ranging from 300 μm to 1800 μm.
2. The stepped wafer according to claim 1,
   wherein said step includes a plurality of steps, and
   each of said steps includes a curved surface with a radius of curvature ranging from 300 μm to 1800 μm.
3. The stepped wafer according to claim 1,
   wherein said step includes a sloped portion and a flat portion, and
   said curved surface is formed at least at a boundary between said sloped portion and said flat portion.
4. A method for manufacturing a stepped wafer having a step and a main surface, wherein the stepped wafer is thinner in a center portion and is thicker in an outer periphery, said method comprising

(a) forming said step including a curved surface with a radius of curvature in cross-section ranging from 300 μm to 1800 μm.

5. The method according to claim 4,
wherein in said step (a),
a plurality of steps including said step are formed, and
each of said steps includes a curved surface with a radius of curvature ranging from 300 μm to 1800 μm.

6. The method according to claim 4,
wherein in said step (a),
said step includes a sloped portion and a flat portion, and
said curved surface is formed at least at a boundary between said sloped portion and said flat portion.

7. The method according to claim 5,
wherein in said step (a), said step closer to said center portion is formed by a grinding wheel less coarse than a grinding wheel used for forming said step closer to said outer periphery.

* * * * *